(12) United States Patent
Goubault de Brugiere et al.

(10) Patent No.: US 9,368,472 B2
(45) Date of Patent: Jun. 14, 2016

(54) FLIP-CHIP ASSEMBLY PROCESS FOR CONNECTING TWO COMPONENTS TO EACH OTHER

(71) Applicant: COMMISSARIAT A L'ENERGIE ATOMIQUE ET AUX ENERGIES ALTERNATIVES, Paris (FI)

(72) Inventors: Baptiste Goubault de Brugiere, La Buisse (FR); Alexis Bedoin, Fontaine (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 302 days.

(21) Appl. No.: 13/955,246

(22) Filed: Jul. 31, 2013

(65) Prior Publication Data

US 2014/0038355 A1 Feb. 6, 2014

(30) Foreign Application Priority Data

Jul. 31, 2012 (FR) ..................... 12 57406

(51) Int. Cl.
*H01L 21/00* (2006.01)
*H01L 23/00* (2006.01)
(52) U.S. Cl.
CPC ............. *H01L 24/81* (2013.01); *H01L 24/14* (2013.01); *H01L 24/16* (2013.01); *H01L 24/83* (2013.01); *H01L 24/92* (2013.01); *H01L 24/13* (2013.01); *H01L 24/17* (2013.01); *H01L 2224/13005* (2013.01); *H01L 2224/13082* (2013.01); *H01L 2224/13109* (2013.01); *H01L 2224/13111* (2013.01); *H01L 2224/13124* (2013.01); *H01L 2224/13139* (2013.01); *H01L 2224/13147* (2013.01); *H01L 2224/1403* (2013.01); *H01L 2224/1416* (2013.01); *H01L 2224/14051* (2013.01); *H01L 2224/14131* (2013.01); *H01L 2224/14505* (2013.01); *H01L 2224/1601* (2013.01); *H01L 2224/16104* (2013.01); *H01L 2224/16225* (2013.01); *H01L 2224/16227* (2013.01); *H01L 2224/1703* (2013.01);

(Continued)

(58) Field of Classification Search
USPC .................................. 438/106–123
See application file for complete search history.

(56) References Cited

U.S. PATENT DOCUMENTS 5,667,132 A 9/1997 Chirovsky et al. ....... 228/180.22
7,160,757 B2 * 1/2007 Narkhede ........... H01L 21/4853
257/E21.499

(Continued)

OTHER PUBLICATIONS

Preliminary Search Report issued in French Patent Application No. 1257406, mailed Apr. 26, 2013.

*Primary Examiner* — Marc Armand
*Assistant Examiner* — Wilner Jean Baptiste
(74) *Attorney, Agent, or Firm* — Norton Rose Fulbright US LLP

(57) ABSTRACT

The invention relates to a flip-chip assembly process for connecting two microelectronic components (1, 2) to each other. According to the invention, it is possible to proportion either the spacers (24) so that they are smaller than the interconnect bumps (22) or to oversize the latter so that their deformation, after having been plastic during the insertion of connective inserts (12), returns to the elastic regime once assembly contact between components (1,2) has been reached. Thanks to the invention, it is possible to control with great precision the gap between the two components during their assembly, and this without adding any additional steps to their manufacturing or to the assembly process.

20 Claims, 5 Drawing Sheets

(52) U.S. Cl.
CPC ........... *H01L2224/17505* (2013.01); *H01L 2224/73103* (2013.01); *H01L 2224/73203* (2013.01); *H01L 2224/8114* (2013.01); *H01L 2224/8183* (2013.01); *H01L 2224/81099* (2013.01); *H01L 2224/81193* (2013.01); *H01L 2224/81201* (2013.01); *H01L 2224/81345* (2013.01); *H01L 2224/83102* (2013.01); *H01L 2224/9221* (2013.01); *H01L 2924/0132* (2013.01); *H01L 2924/0133* (2013.01)

(56) References Cited

U.S. PATENT DOCUMENTS

| | | | |
|---|---|---|---|
| 2005/0104222 A1 | 5/2005 | Jeong et al. | 257/778 |
| 2007/0045387 A1* | 3/2007 | Marion | 228/180.22 |
| 2010/0007019 A1 | 1/2010 | Pendse | 257/373 |
| 2011/0304058 A1 | 12/2011 | Pendse | 257/778 |
| 2012/0049079 A1* | 3/2012 | Yanoff et al. | 250/370.13 |
| 2012/0120622 A1 | 5/2012 | Marion et al. | 361/758 |

* cited by examiner

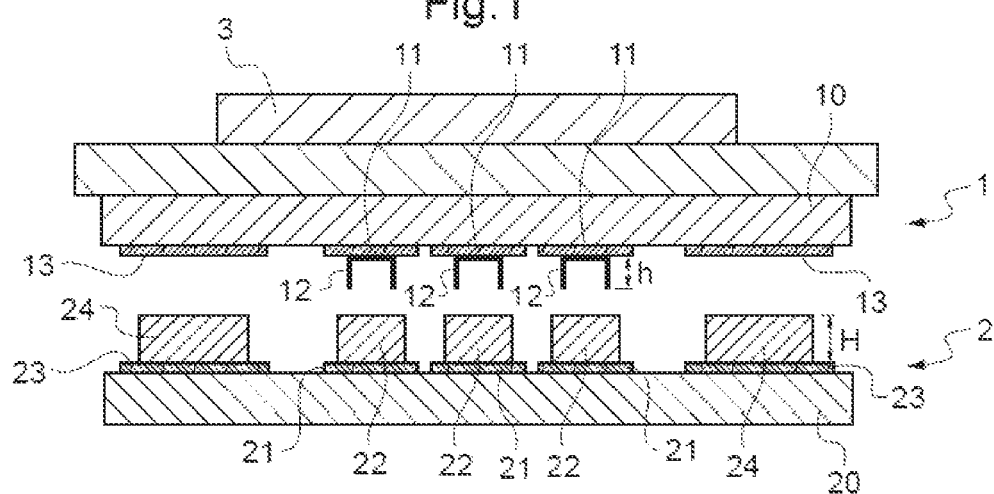
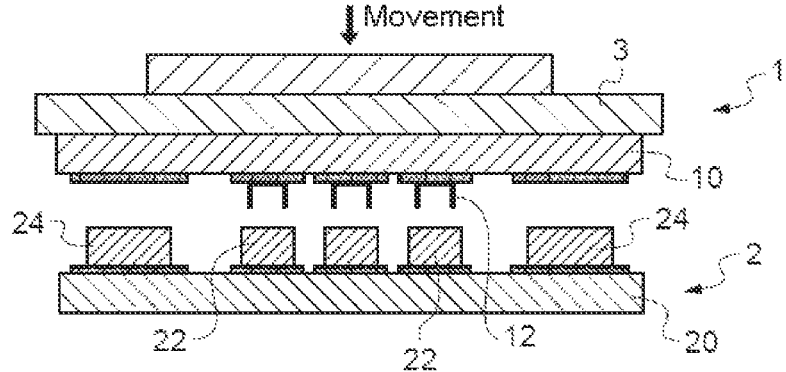
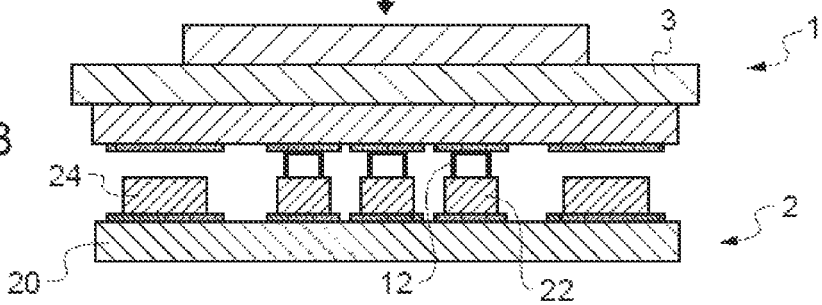
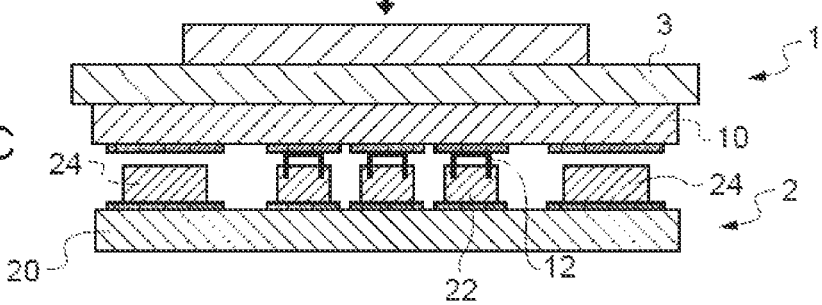

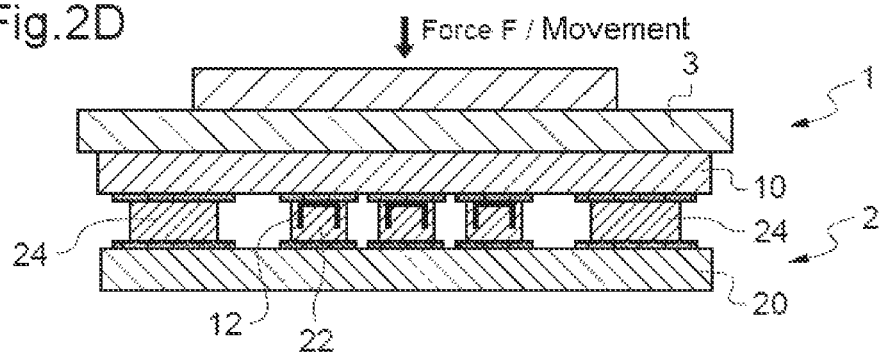
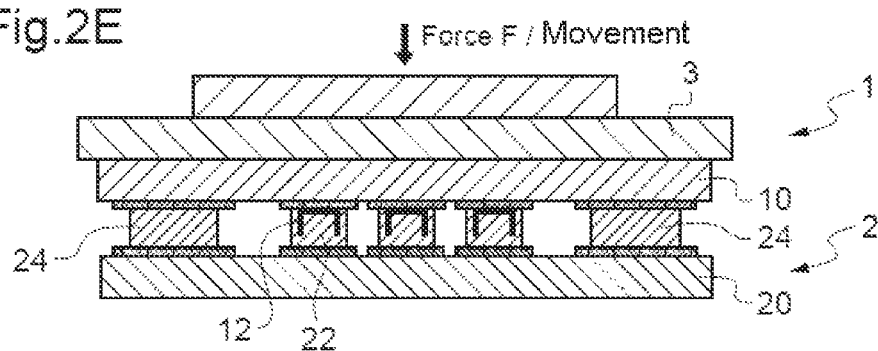
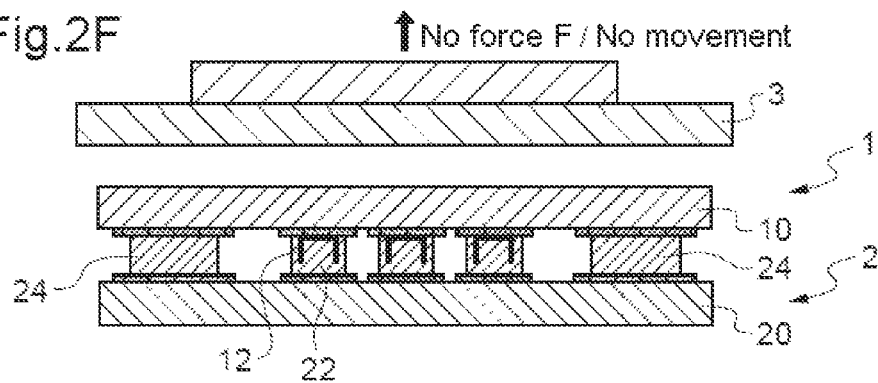

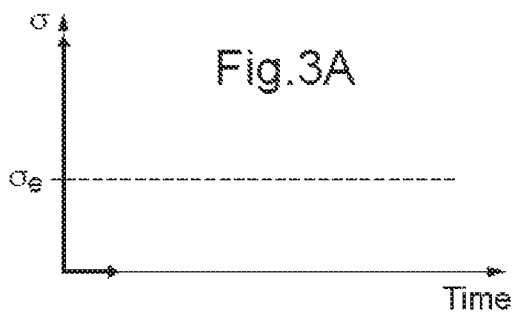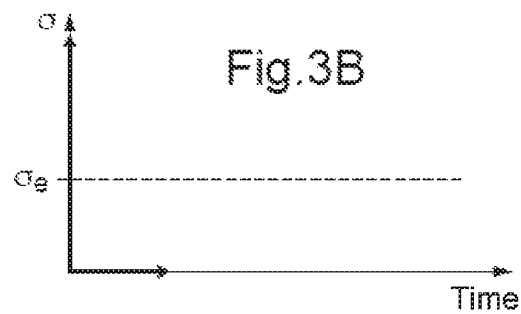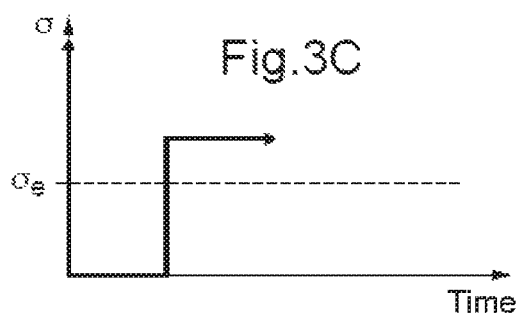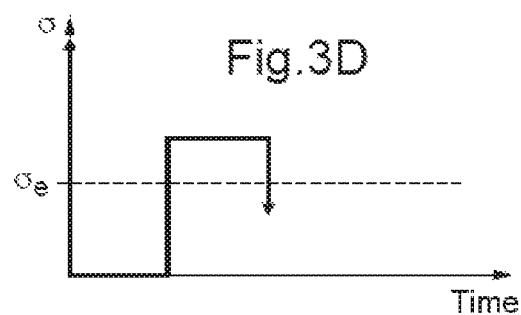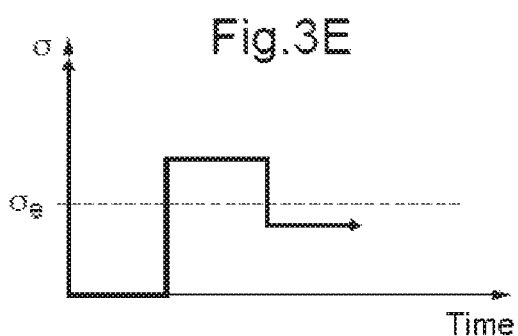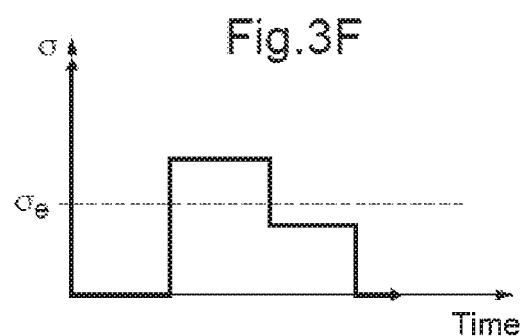

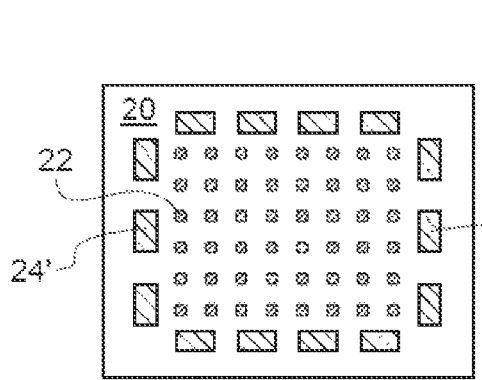
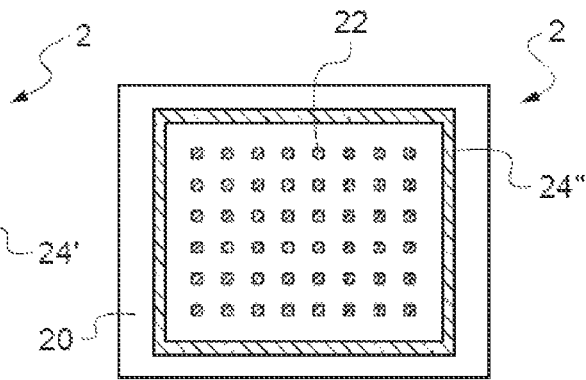
Fig.6A  Fig.6B
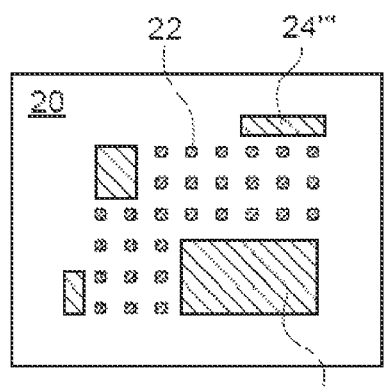
Fig.6C
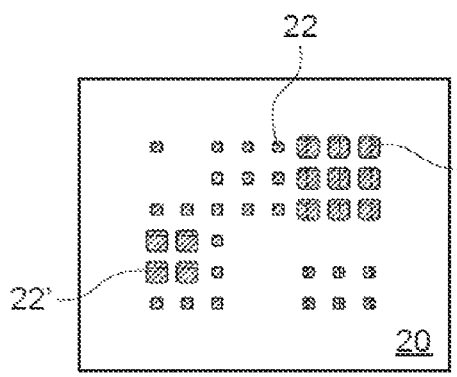
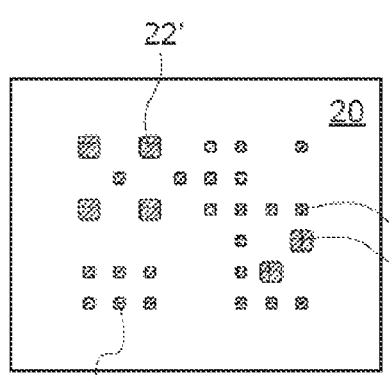
Fig.7A  Fig.7B

FLIP-CHIP ASSEMBLY PROCESS FOR CONNECTING TWO COMPONENTS TO EACH OTHER

BACKGROUND OF THE INVENTION

1. Field of the Invention

The present invention relates to an assembly process for connecting two electronic components to each other, of the vertical connection type more commonly called the "flip-chip" process, according to which one of the two electronic components is flipped to enable vertical electrical connections or assemblies to be made.

The invention makes it possible to obtain an assembly between electronic components whatever their interconnect pitch and the gap between these components.

The invention more particularly relates to the assembly between a chip and a substrate, for example both made of silicon.

The invention aims to control the final gap between electronic components once the assembly is produced.

In the context of the invention "assembly process for connecting two electronic components to each other" will be understood to mean either an assembly of two components of different materials or an assembly of two components made of the same material. In particular, an assembly according to the invention may relate to an assembly between an electronic chip and a substrate, both possibly being made from silicon.

The expression "interconnect pitch" refers to the distance between two connection pads on the same electronic component.

The expression "gap between components" refers to the distance between two opposing components, defined by the interconnection height.

2. Description of Related Art

The so-called "flip-chip" technique is a well-known technique for mechanically and electrically interconnecting, or assembling, two components such as a chip and a printed circuit board. This technique called the "flip-chip" technique because one of the components, generally the chip, which carries conductors, is flipped to bring the two components face-to-face in order to allow interconnections to be formed by joining the conductors and metallic bumps, and contacts to be produced on the other component, generally a printed circuit board.

Where this technique is concerned, efforts are constantly being made to reduce the gap between components while allowing for an ever higher number of connections. Currently, the three main known categories of assembly using this technique—soldering, thermocompression bonding and the use of adhesives, such as ACFs (anisotropic conductive films)—each have their own limitations when it comes to reducing the gap.

In particular, low-temperature thermocompression with penetration of conductive inserts into bumps, such as described in the patent application WO 2006/054005, is limited by the very large force that is required to establish a very high number of connections, and by virtue of the feasibility of production of the inserts themselves.

Thus, to overcome the limitations of this process, the Applicant has proposed in patent application WO 2009/115685 to produce conductive inserts in the form of blind-tubes of which the base is securely fastened to the area of a component. Conductive inserts were the subject of an improvement patent application EP 2 287 904 with at least one area of the open end of an insert left free in order to allow gases contained in the insert to escape during insertion. This patent provides various new shapes for the conductive inserts such as open bar, elements with star-shaped or cruciform cross sections, lobed etc. Although broadly satisfactory in terms of the required force level and feasibility of production of the inserts, the process according to these patent applications could still be improved upon.

More particularly, the inventors of the present application have sought a solution that will make it possible to control with certainty and great precision the gap between two components to be hybridized using a low-temperature thermocompression process, and to avoid any risk of electrical short-circuits between the conductive inserts of one component and the connection pads of the other component.

It is already known in the art concerning the "flip-chip" technique to use various types of spacers, i.e. spacers that allow a constant gap to be maintained between components.

Patent applications FR 2 694 841, US 2003/0038157 and WO 93/06964 implement a soldering process and disclose the use of spacers the constituent material of which, has a higher melting point than the interconnect bumps in order to remain solid during the melting, commonly called reflow, of said interconnect pads.

Patent application US 2005/0104222 proposes to use spacers in the form of discontinuous strips which are reflowed at the same time as the interconnect bumps. Here the spacers are produced to compensate for stresses caused by thermal expansion during operation.

Patent application JP 3 030 349 proposes to produce spacers in the form of drops of an adhesive, such as a silicone adhesive, injected by syringe, which drops make it possible to absorb some of the stresses created during reflow of the interconnect bumps, while also guaranteeing the gap between chips.

Patent application WO 2011/018572 proposes to use spacers taking the form of balls at the ends of the components, an insert secured to one of the components being inserted into each ball. The spacers have a height that must be greater than a hermetic strip arranged internally to the spacers, in order to seal bolometer support studs. The spacers formed by the balls are plastically deformed during assembly of the components.

Patent application FR 2 928 032 proposes to use spacers level with each buried interconnect track in which a tip is inserted. These spacers of conductive and ductile material support the tips and have a height that makes it possible to locally control the penetration of the tip into the buried track, thereby avoiding the use of an adhesive.

Patent application US 2010/079631 relates to a process for manufacturing an imaging device and proposes joining components together by the inserting pins into a plastically deformed material. Spacers are placed between each contact pad of ductile material on each of the components in order to prevent the pins from passing right through the ductile pads. A significant drawback is that the spacers of components that must bear against each other must be perfectly aligned with each other. In addition, here the spacers are located on both faces of the components, which spacers are made from a different material to the interconnections themselves: they must therefore be perfectly aligned to be useful. Systematically placed between the connections, they limit the minimum distance between two connections, i.e. they limit the pitch.

The general aim of the invention is to propose an improvement of the assembly process according to aforementioned patent applications WO 2009/115686 and EP 2 287 904 and which palliates at least some of the drawbacks of the prior art mentioned above.

One particular aim of the invention is to propose a solution allowing the gap between two microelectronic components assembled using a low-temperature thermocompression process to be controlled with certainty and great precision, and any risk of electrical short-circuit between the conductive inserts of one component and the connection pads of the other component to be avoided.

SUMMARY OF THE INVENTION

To do this, the first subject of the invention, according to one alternative, is a flip-chip assembly process for connecting two microelectronic components to each other, said components each comprising one face, the so-called assembly face, in which the two assembly faces are brought closer together and a given constant force F is applied to one and/or the other of the components, one and/or the other assembly face(s) comprising:
- connective inserts of stiff material;
- interconnect bumps of ductile material having a given elastic limit $\sigma_e$, the interconnect bumps of a component having an area S1 of contact with the other component once the two components have been assembled; and
- spacer bumps, called spacers, the spacers of a component having an area S2 of contact with the other component once the two components are assembled; process in which, prior to the application of the force F:
- the inserts are aligned opposite the interconnect bumps;
- on the one hand, the height H of the spacers is set so that it is greater than that h of the connective inserts once the two components have been assembled and, on the other hand, the area S2 of the spacers is set so that when they make contact with the other component the stress $\sigma$ generated in the interconnect bumps, generated by the force F, equal to F/(S1+S2), is less than or equal to their elastic limit $\sigma_e$; and then
- the given constant force F is applied in order to make the inserts penetrate into the interconnect bumps until the spacers of one component are brought into assembly contact with the other component, defining the contact areas S1 and S2.

Preferably, to simplify production, the interconnect bumps and the spacers are produced from the same material, and preferably in the same manufacturing steps. It is also possible, as a variant, to produce the interconnect bumps and spacers from different materials. According to this variant, it is then advantageous to choose a harder material for the spacers than for the interconnect bumps. By way of example, spacers made of gold or tungsten could be used with interconnect bumps made of indium.

This first alternative is advantageously implemented when the interconnect pitch between two connection pads is very small, preferably when it is less than or equal to 50 µm.

The spacers are preferably of parallelepipedal or cylindrical shape. The arrangement of the spacers may be peripheral or otherwise. A peripheral arrangement may be provided with the spacers taking the form of a continuous strip or a discontinuous ring. A non-peripheral arrangement of spacers distributed in groups within the interconnect bumps may also be provided.

By virtue of the invention, it is possible to control, with great precision, the gap between two components during their assembly and this without adding any additional steps to their manufacture or to the assembly process. Thus, in this first alternative of the invention, two components, particularly two microelectronic chips, are assembled using spacers the material of which is preferably identical to that of the interconnect bumps. The spacers according to the invention are proportioned in such as way as to drastically increase the contact area between the two components, preferably when the inserts are completely inserted into the bumps, and thus to significantly reduce the stress generated in the interconnect bumps. This decrease in stress makes it possible to pass from the plastic region to the elastic region in the interconnect bumps in such a way as to stop their irreversible plastic deformation. Specifically, to achieve insertion of the inserts into the interconnect bumps, the latter must be plastically deformed. The force applied to the components must therefore make it possible to exceed the elastic stress limit of the material forming the interconnect bumps. This insertion force is therefore calculated depending on the properties of the constituent material of the bumps. According to the invention, when the inserts are preferably completely inserted into the bumps and the components make contact with the spacers, the contact area drastically increases and makes the stress in the interconnect bumps drop to below their elastic stress limit. Thus, however long the applied force is maintained, the gap between assembled components no longer varies. The main advantage of the invention is to definitively suppress any short circuit problems.

According to a second alternative, another subject of the invention is a flip-chip assembly process for connecting two microelectronic components to each other, said components comprising a number of faces, one of which is called the assembly face, in which the two assembly faces are brought together and a given constant force F is applied to one and/or the other of the components, one and/or the other assembly face(s) comprising:
- connective inserts of stiff material;
- interconnect bumps of ductile material having a given elastic limit $\sigma_e$, each fabricated on a connecting pad, the interconnect bumps of a component having an area S'1 of contact with the other component once both components have been assembled;

process in which prior to the application of the force F:
- the inserts are aligned with the interconnect bumps;
- on the one hand, the height H' of the interconnect bumps is set so that it is greater than that h of the connecting inserts once the two components have been assembled and, on the other hand, the area S'1 of the bumps is set so that when they make contact with the other component the stress $\sigma$ generated in the interconnect bumps generated by the force F, equal to F/S'1, is less than or equal to their elastic limit $\sigma_e$; and then
- the given constant force F is applied in order to make the inserts penetrate into the bumps until the bumps of one component are brought into contact with the other component, thereby defining the contact area S'1.

Therefore, this second alternative according to the invention does not strictly speaking require spacers, i.e. bumps separate from the connecting ones and which are added in the first alternative to increase the contact area between components during assembly. In other words, according to this second alternative, the plastic deformation of the interconnect bumps initially in the assembly alone induces an increase in the area S'1 large enough that during the final phase of the assembly the stress generated once more becomes less than the elastic deformation limit of the bumps. In the case where S'1 is proportioned so that $\sigma_e = F/S'1$, the area of the bumps is enough to cause the insertion to stop on contact between the bumps and the other component, without plastic deformation of the bumps.

This second alternative is advantageously implemented when the interconnect pitch between two connection pads is small, preferably when it is less than or equal to 20 µm.

Advantageously, according to both alternatives of the invention, the alignment and the application of the force F are carried out at room temperature.

The ductile material forming the interconnect bumps and, if relevant, the spacers is (are) preferably chosen from indium, an aluminium-copper alloy, SnAgCu, SnAg, SnCu, SnCu, Al alone, or Cu alone.

The inserts according to the invention are preferably blind-tubes the base of which is fixed to a connection pad. The inserts are thus advantageously manufactured as described in patent application WO 2009/115686 or in application EP 2 287 904. Generally, the conductive inserts according to the invention take any form: microtube, tip, open bar, element with star-shaped or cruciform cross section, lobes etc. Provided the stress generated in the interconnect bumps is less than or equal to their elastic limit $\sigma_e$, the force F can be maintained for a certain time.

The gap between the two components, corresponding to the height H or H', is less than 20 μm and typically equal to 2 μm.

According to one advantageous embodiment, one of the components is a chip and the other component is a printed circuit board.

BRIEF DESCRIPTION OF THE DRAWINGS

Other advantages and features of the invention will become more clearly apparent upon reading the detailed non-limiting description of the invention, given by way of illustration and with reference to the following figures in which:

FIG. 1 is a schematic cross-sectional view of two components before their assembly according to the first alternative of the invention;

FIGS. 2A to 2F illustrate the various steps of assembly of two components according to the first alternative of the invention;

FIGS. 3A to 3F illustrate the various curves of stress created in the interconnect bumps at each step of the assembly illustrated in FIGS. 2A to 2F;

FIGS. 6A to 6C are schematic top views of a component showing various possible arrangements of interconnect bumps and spacers according to the first alternative of the invention; and FIGS. 7A and 7B are schematic top views of a component showing two possible arrangements of interconnect bumps according to the second alternative of the invention.

DETAILED DESCRIPTION

Figure 4:
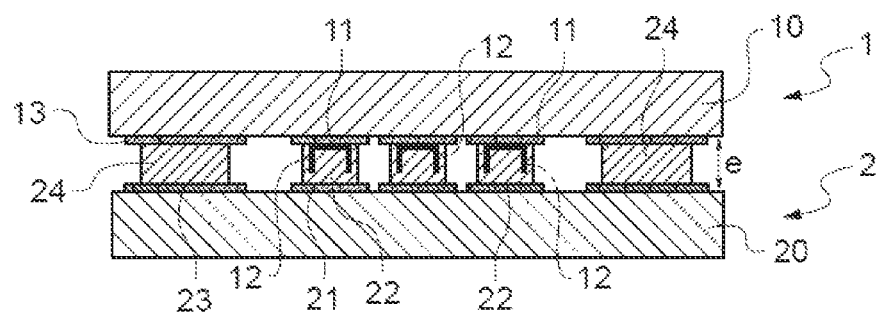
FIG. 4 is a cross-sectional view illustrating an assembly of two components after their assembly according to the first alternative of the invention.

FIG. 1 shows two electronic components 1, 2 such as electronic chips for hybridization according to the first alternative of the invention using a press tool 3 bearing on the upper component 1.

Component 1, which is the flipped one, comprises a substrate 10 on which connection pads 11 of equal height have been fabricated. On each of the connection pads 11 a conductive insert 12 in the shape of a blind-tube is secured by its base. To make these conductive inserts 12, the procedure described in patent application WO 2009/115686 was advantageously followed. On the periphery of the connection pads 11 other pads 13 of the same height as that of the connection pads 11 were fabricated, preferably simultaneously.

Component 2, meanwhile, comprises a substrate 20 on which connection pads 21 of equal height were fabricated. Each of the connection pads 21 is surmounted by a connection bump 22 of parallelepipedal shape. On the periphery of the connection pads 21 other connection pads 23 of the same height as that of the connection pads 21 were made, preferably simultaneously. The interconnect bumps 22 have an area S1 of contact with the component 1 once the two components are assembled.

According to the first alternative of the invention, each of these peripheral pads 23 is surmounted by a spacer bump 24, called a spacer. The spacers 24 have an area S2 of contact with the component 1.

According to the invention, are determined by calculation:
the height H so that it is greater than that h of the inserts 12;
the area S2 of the spacers 24 so that when they make contact with component 1 as detailed below, the stress $\sigma$ generated in the interconnect bumps 22, generated by the assembly force F, equal to F/(S1+S2), is less than or equal to their elastic limit $\sigma_e$.

Tables 1 to 3 below present three examples of calculations for making an assembly according to the invention. Table 1 presents the case of interconnect bumps 22 and spacers 24 made of indium for which the elastic limit under consideration is equal to 1 MPa, table 2 presents the case of interconnect bumps 22 and spacers 24 made of aluminium-copper for which the elastic limit under consideration is equal to 100 MPa, and finally table 3 presents the case of interconnect bumps 22 and spacers 24 in any material with an elastic limit under consideration of 40 MPa.

It is specified here that in tables 1 to 3 all the dimensions of the spacers 24 are calculated in meters and in considering a continuous peripheral strip. Also, are mentioned respectively the width, length and thickness of the strip, i.e. of the continuous peripheral strip.

TABLE 1

| | | | | |
|---|---|---|---|---|
| Number of connections 11, 21 | | 95076 | 353508 | 1152692 |
| Height H of the interconnect bumps 22 (μm) | | 2.78 | 5.34 | 10.46 |
| Force F applied t components 1, 2 (N) | | 7.5 | 30 | 120 |
| Stress limit to obtain (MPa) | | 1 | 1 | 1 |
| Contact areas ($m^2$) | Total necessary area | $7.5 \times 10^{-6}$ | $3.00 \times 10^{-5}$ | $1.20 \times 10^{-4}$ |
| | Area S1 of the interconnect bumps 22 | $4.66 \times 10^{-6}$ | $1.73 \times 10^{-5}$ | $5.65 \times 10^{-5}$ |
| | Set area S2 of the spacers 24 | $2.84 \times 10^{-6}$ | $1.27 \times 10^{-5}$ | $6.35 \times 10^{-5}$ |
| Dimensions of the spacers 24 (m) | Width of the strip | $2.80 \times 10^{-3}$ | $5.36 \times 10^{-3}$ | $10.48 \times 10^{-3}$ |
| | Length of the strip | $3.44 \times 10^{-3}$ | $6.64 \times 10^{-3}$ | $11.04 \times 10^{-3}$ |
| | Thickness of the strip | $213 \times 10^{-6}$ | $488 \times 10^{-6}$ | $1320 \times 10^{-6}$ |

TABLE 2

| | | | | |
|---|---|---|---|---|
| Number of connections 11, 21 | | 95076 | 353508 | 1152692 |
| Height H of the interconnect bumps 22 (μm) | | 2.78 | 5.34 | 10.46 |
| Force F applied to components 1, 2 (N) | | 550 | 2200 | 8800 |
| Stress limit to obtain (MPa) | | 100 | 100 | 100 |
| Contact areas | Total necessary area | $5.5 \times 10^{-6}$ | $2.20 \times 10^{-5}$ | $8.80 \times 10^{-5}$ |

TABLE 2-continued

| | | | | |
|---|---|---|---|---|
| (m²) | Area S1 of the interconnect bumps 22 | $4.66 \times 10^{-6}$ | $1.73 \times 10^{-5}$ | $5.65 \times 10^{-5}$ |
| | Set area S2 of the spacers 24 | $8.41 \times 10^{-7}$ | $4.68 \times 10^{-6}$ | $3.15 \times 10^{-5}$ |
| Dimensions of the spacers 24 (m) | Width of the strip | $2.80 \times 10^{-3}$ | $5.36 \times 10^{-3}$ | $10.48 \times 10^{-3}$ |
| | Length of the strip | $3.44 \times 10^{-3}$ | $6.64 \times 10^{-3}$ | $11.04 \times 10^{-3}$ |
| | Thickness of the strip | $66 \times 10^{-6}$ | $189 \times 10^{-6}$ | $688 \times 10^{-6}$ |

TABLE 3

| | | | | |
|---|---|---|---|---|
| Number of connections 11, 21 | | 95076 | 353508 | 1152692 |
| Height H of the interconnect bumps 22 (μm) | | 2.78 | 5.34 | 10.46 |
| Force F applied to components 1, 2 (N) | | 250 | 1000 | 4000 |
| Stress limit to obtain (MPa) | | 40 | 40 | 40 |
| Contact areas (m²) | Total necessary area | $6.25 \times 10^{-6}$ | $2.50 \times 10^{-5}$ | $8.80 \times 10^{-5}$ |
| | Area S1 of the interconnect bumps 22 | $4.66 \times 10^{-6}$ | $1.73 \times 10^{-5}$ | $1.00 \times 10^{-4}$ |
| | Set area S2 of the spacers 24 | $1.59 \times 10^{-6}$ | $7.68 \times 10^{-6}$ | $4.35 \times 10^{-5}$ |
| Dimensions of the spacers 24 (m) | Width of the strip | $2.80 \times 10^{-3}$ | $5.36 \times 10^{-3}$ | $10.48 \times 10^{-3}$ |
| | Length of the strip | $3.44 \times 10^{-3}$ | $6.64 \times 10^{-3}$ | $11.04 \times 10^{-3}$ |
| | Thickness of the strip | $123 \times 10^{-6}$ | $304 \times 10^{-6}$ | $931 \times 10^{-6}$ |

The various steps of assembly according to the first alternative of the invention are now described with reference to FIGS. 2A and 3F. It will be noted that in FIGS. 3A to 3F, the horizontal dotted line indicates the elastic limit $\sigma_e$ of the interconnect bumps 22.

Step 1: the two components 1,2 are brought together and aligned so as to have each insert 12 facing an interconnect bump 22 (FIG. 2A). The stress generated in the interconnect bumps 22 is nil (FIG. 3A).

Step 2: contact between inserts 12 and interconnect bumps 22 is detected (FIG. 2B). The stress generated in the interconnect pads is roughly nil (FIG. 3B).

Step 3: The force F is applied, which leads to the insertion of the inserts 12 into the bumps 22, i.e. a loading and the plastic deformation of the latter (FIG. 2C). The stress created in the interconnect bumps 22 immediately exceeds the elastic limit $\sigma_e$ then remains more or less constant (FIG. 3C). Indeed, from the application of the force F, the stress σ generated in the bumps 2 is equal to F/Si, in which Si denotes the cross section of the inserts 12. The cross section Si being very small with respect to the applied force, the stress generated is very high and each bump 22 is then plastically deformed. Throughout the application of the force F and for as long as the inserts 12 are only in insertion contact with the bumps 22, the stress generated remains constant since equal for each bump to F/Si and in their plastic regime. Insertion of each insert 12 therefore occurs by plastic deformation of each corresponding bump 22.

Step 4: the force F is applied until total insertion of the inserts 12 in the bumps, which corresponds exactly to the assembly contact of the peripheral pads 13 with the spacers 24 as well as the pads 13 to which the inserts 12 are secured (FIG. 2D). The stress generated in the interconnect bumps 22 drops drastically and returns below the elastic limit $\sigma_e$ of their constituent material (FIG. 3D).

In fact, here, the stress σ generated in each bump 22 becomes equal to F/(S1+S2), since the contact area during the assembly becomes equal to the sum of the areas S1 of the bumps 22 and S2 of the spacers 24. In other words, the large increase of contact area between the insertion contact, where the area on which the force F is applied is that of the inserts Si, and the assembly contact, where the area becomes equal to S1+S2, induces the reduction in the stress created in each bump to below its elastic limit $\sigma_e$. Since the stress generated in each bump 22 is in the elastic regime, the deformation induced in the latter is very low, in accordance with Hooke's law when one applies, and then continues to apply, the constant force F. Typically, for a bump 22 of aluminium-copper of a thickness of the order of 2 μm, it is considered that at the most its deformation will be of 0.02%, i.e. a height variation equal to 0.004 μm, which is negligible. This therefore means that once the assembly contact has been reached, one may continue to apply the force F without running the risk of the inserts 12 continuing to insert themselves (sink) into the interconnect bumps 22. In other words, once the assembly contact has been reached with the elastic region of the bumps 22, in the case where the initial insertion force F is maintained, there is no risk of damage to the inserts 12 by undesired contact with the lower component 2, typically a printed circuit board. And, especially, there is no risk of damage of the component 1, typically a chip, because the suffered constraints are limited.

Step 5: the applied force F is maintained during any time period (FIG. 2E). The stress generated in the interconnect bumps 22 no longer varies as the applied force and the total contact area between the two components 1, 2 are constant (FIG. 3E).

Step 6: unloading and retraction of the press tool 3 is carried out (FIG. 2F). The stress created in the interconnect bumps 22 drops to zero (FIG. 3F). The two components 1, 2 are assembled (hybridized) with the electrical connection established between each connection pad 11 and each connection pad 21.

It is specified here that a flow can be used, or a controlled atmosphere may be obtained during insertion. This can in particular make it possible to break up the oxide during thermocompression assemblies. In the case of conductive inserts in the form of microtubes, the assembly is made at room temperature and the oxides are broken up when a microtube is inserted into the corresponding bump.

FIG. 4 shows an assembly obtained according to the assembly process that has just been described.

Figure 5:
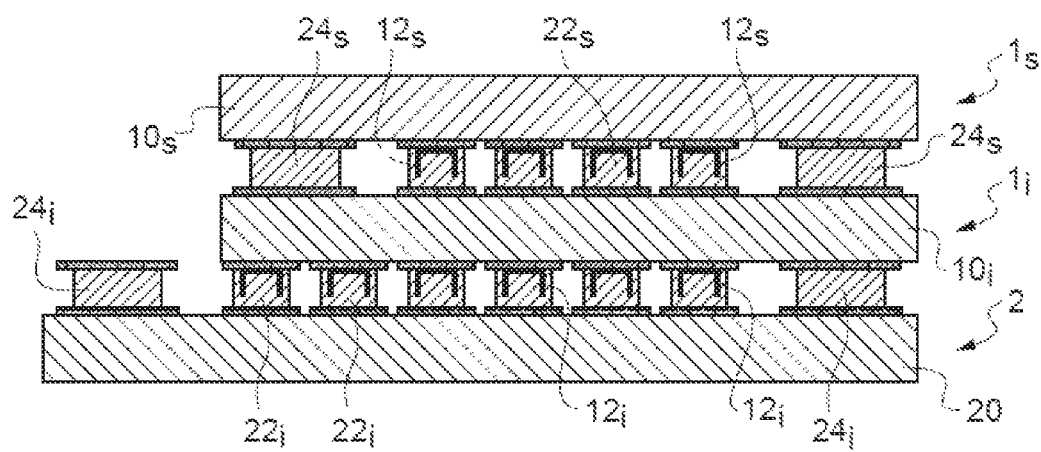
FIG. 5 is a cross-sectional view illustrating a stack of two two-component assemblies after their assembly according to the first alternative of the invention.

FIG. 5 shows a stack of two assemblies, each obtained using the assembly process that has just been described. During assembly of the upper component 1s, the gap between the lower components 1i, 2 remains identical due to the fact that the lower interconnect bumps 22i and spacers 24 have previously been defined in such a way that they remain in the elastic region during the insertion of the upper conductive inserts 12. By way of example and with reference to table 2, it is for example possible to envisage, for all the spacers and bumps in aluminium-copper (Al—Cu) material, a stack of two assemblies with:

a number of interconnects equal to 353508 in the lower assembly, the constant applied force during insertion being equal to 2200 N;

a number of interconnects equal to 95076 in the upper assembly, the constant applied force during insertion being equal to 550 N.

FIGS. 6A and 6C show various possible relative arrangements of the spacers 24 in relation to the interconnect bumps 22. Thus, spacers 24' distributed in the shape of a discontinuous peripheral ring around the bumps 22 (FIG. 6A) could be provided. A single spacer 24" in the form of a continuous peripheral strip around the bumps 22 (FIG. 6B) can also be provided. Finally, spacers 24''' in groups distributed within the bumps 22 (FIG. 6C) can also be provided.

According to another alternative of the invention, no spacers 24 are provided: to do this, it is necessary to calculate the initial area and height of the interconnect bumps 22 so that it is only their plastic deformation that induces the gradual change of contact area and therefore the drop to below their elastic limit. Thus, by way of example, repeating the same figures of the left-hand column in table 1, i.e. with a number of connections equal to 95076, if in the end a gap e between the components 1, 2 of about 2 µm is desired, the initial height H' of the bumps 22 is increased to a value of about 3.2 µm.

FIGS. 7A and 7B show two example embodiments according to this alternative. FIG. 7A differs from FIG. 7B in the relative arrangement of the interconnect bumps 22, 22' over the substrate surface 20. Thus, the area necessary to obtain the drop below the elastic limit of the interconnect bumps 22, 22' corresponds exactly to the total area of these bumps 22, 22'. Thus, the interconnect bumps 22, 22' will plastically deform during the insertion of the conductive inserts until the total area thus deformed allows them to return to below their elastic limit. It is obvious that although in these figures, the bumps 22' are shown having a cross section far larger than the bumps 22, it is possible for all the interconnect bumps to have the same unitary cross section.

Other variants and improvements may be provided without departing from the scope of the invention.

Thus, in all the figures, the spacers 24 are made on pads 23, for reasons of ease of manufacturing. In particular, in relation to the manufacturing process described in the aforementioned patent application EP 2 287 904, the addition of dedicated pads 23 for the spacers 24 allows for very precise control of the gap between components 1, 2 without an additional production step being necessary and without extra cost. This being so, it is very possible to remove the pads 23 dedicated to the spacers 24.

Moreover, it is possible to produce the assembly according to the invention between two printed circuit boards or between a component such as a detector and another component such as a read circuit, a sensor and another sensor.

It is also possible to fabricate spacers and interconnect bumps each in a stack of materials, for example in the form of a copper pillar covered with a layer of SnAgCu.

Once the assembly has been produced, it is possible to complete the process by a deposition of adhesive achieved by capillarity. In the case where one (or both) of the components has been coated, before assembly, with adhesive, it is advantageous to use an adhesive with low viscosity. It can then be considered that the influence of the presence of the adhesive on the components is negligible in the face of the applied forces.

The invention is not limited to the examples that have just been described; features from the examples illustrated can be notably combined within non-illustrated variants.

The invention claimed is:

1. A flip-chip assembly process for connecting two microelectronic components to each other, said components each comprising a face called the assembly face, in which the two assembly faces are brought together and a given constant force F is applied to one and/or the other of the components, one and/or the other assembly face(s) comprising:
   connective inserts of stiff material;
   interconnect bumps of ductile material having a given elastic limit $\sigma_e$, the interconnect bumps of a component having an area S1 of contact with the other component once the two components have been assembled; and
   spacer bumps, called spacers, the spacers of a component having an area S2 of contact with the other component once the two components have been assembled,
process in which, prior to the application of the force F:
   the inserts are aligned opposite the interconnect bumps;
   on the one hand, the height H of the spacers is set so that it is greater than that h of the connective inserts once the two components have been assembled and, on the other hand, the area S2 of the spacers is set so that, when they make contact with the other component, the stress $\sigma$ generated in the interconnect bumps, generated by the force F, equal to F/(S1+S2), is less than or equal to their elastic limit $\sigma_e$; and then
   the given constant force F is applied in order to make the inserts penetrate into the interconnect bumps until the spacers of one component are brought into assembly contact with the other component, defining the contact areas S1 and S2.

2. The process of claim 1, wherein the interconnect bumps and the spacers are produced from the same material.

3. The process of claim 1, wherein the interconnect pitch between two connection pads of a component is smaller than or equal to 50 µm.

4. The process of claim 1, wherein the spacers are of parallelepipedal or cylindrical shape.

5. The process of claim 1, wherein the spacers are arranged in the shape of a discontinuous ring or in the shape of a continuous peripheral strip.

6. The process of claim 1, wherein the spacers are distributed in one or more groups within the bumps.

7. The process of claim 1, wherein the alignment and the application of the force F are carried out at room temperature.

8. The process of claim 1, wherein the ductile material forming the interconnect bumps and, if relevant, the spacers is (are) chosen from indium, an aluminium-copper alloy, SnAgCu, SnAg, AgCu, SnCu, Al alone and Cu alone.

9. The process of claim 1, wherein the inserts are blindmicrotubes the bases of which tubes are fixed to connection pads.

10. The process of claim 1, wherein once the stress generated in the interconnect bumps is less than or equal to their elastic limit $\sigma_e$, the force F is maintained for a certain time.

11. The process of claim 1, wherein the gap between the two components, corresponding to the height H or H', is less than 20 µm and typically equal to 2 µm.

12. The process of claim 1, wherein one of the components is a chip and the other component is a printed circuit board.

13. A flip-chip assembly process for connecting two microelectronic components to each other, said components each comprising a face called the assembly face, wherein the two assembly faces are brought together and a given constant force F is applied to one and/or the other of the components, one and/or the other assembly face(s) comprising:
   connective inserts of stiff material;
   interconnect bumps of ductile material having a given elastic limit $\sigma_e$, the interconnect bumps of a component having an area S'1 of contact with the other component once both components have been assembled;
process wherein, prior to the application of the force F:
   the inserts are aligned with the interconnect bumps;
   on the one hand, the height H' of the interconnect bumps is set so that it is greater than that h of the connective inserts once the two components have been assembled and, on the other hand, the area S'1 of the bumps is set so that when they make contact with the other component the stress σ generated in the interconnect bumps, generated by the force F, equal to F/S'1, is less than or equal to their elastic limit $\sigma_e$; and then the given constant force F is applied in order to make the inserts penetrate into the bumps until the bumps of a component are brought into assembly contact with the other component, defining the contact area S'1.

14. The process of claim 13, wherein the interconnect pitch between two connection pads of a component is larger than or equal to 20 μm.

15. The process of claim 13, wherein the alignment and the application of the force F are carried out at room temperature.

16. The process of claim 13, wherein the ductile material forming the interconnect bumps and, if relevant, the spacers is (are) chosen from indium, an aluminium-copper alloy, SnAgCu, SnAg, AgCu, SnCu, Al alone and Cu alone.

17. The process of claim 13, wherein the inserts are blind-microtubes the bases of which tubes are fixed to connection pads.

18. The process of claim 13, wherein once the stress generated in the interconnect bumps is less than or equal to their elastic limit $\sigma_e$, the force F is maintained for a certain time.

19. The process of claim 13, wherein the gap between the two components, corresponding to the height H or H', is less than 20 μm and typically equal to 2 μm.

20. The process of claim 13, wherein one of the components is a chip and the other component is a printed circuit board.

* * * * *